United States Patent
Jeong

(10) Patent No.: US 6,683,507 B2
(45) Date of Patent: Jan. 27, 2004

(54) HIGH-FREQUENCY OSCILLATION CIRCUIT

(76) Inventor: Yeon Moon Jeong, 1-301 Hundae Prime Apt, 631-1, Guui 3 Dong, Kwangjin-Gu, Seoul (KR)

( * ) Notice: Subject to any disclaimer, the term of this patent is extended or adjusted under 35 U.S.C. 154(b) by 0 days.

(21) Appl. No.: 09/682,179

(22) Filed: Aug. 1, 2001

(65) Prior Publication Data

US 2002/0017960 A1 Feb. 14, 2002

(30) Foreign Application Priority Data

Aug. 1, 2000 (KR) .................................... 2000-0044521
Oct. 30, 2000 (KR) .................................... 2000-0063891

(51) Int. Cl.⁷ ................................................ H03B 5/12
(52) U.S. Cl. ............................ 331/117 R; 331/117 D; 331/117 FE; 331/107 SL; 331/177 V
(58) Field of Search ....................... 331/107 SL, 117 R, 331/177 V, 167, 117 D, 117 FE

(56) References Cited

U.S. PATENT DOCUMENTS 4,621,241 A * 11/1986 Kiser ..................... 331/117 R
5,714,914 A    2/1998 Zhou

FOREIGN PATENT DOCUMENTS

| EP | 0868018 A1 | 9/1998 |
|----|------------|--------|
| JP | 55133109 A | 10/1980 |
| JP | 3272205 A  | 12/1991 |
| JP | 7106852 B  | 4/1995 |
| JP | 8023229 B  | 1/1996 |
| JP | 9008549 B  | 1/1997 |
| JP | 9064641 B  | 3/1997 |

* cited by examiner

*Primary Examiner*—Arnold Kinkead
(74) *Attorney, Agent, or Firm*—Burns, Doane, Swecker & Mathis, LLP

(57) ABSTRACT

A high-frequency oscillation circuit in accordance with the present invention includes a resonance circuit for generating oscillation frequency signal; an amplifying means having an input port for receiving the signal originating from the resonance; an inductive element having one port connected to the output port of the amplifying means; an T-shape matching element or strip line; a capacitive element connected to the other port of the inductive element or the T-shape matching element or one port of the strip line; wherein the input part of the amplifying means is connected to the connection point of the inductive element or T-shape matching element and the capacitive element or the other port of the strip line, the inductive element, T-shape matching element or strip line and the capacitor match the impedances of both sides of the amplifying means and form low pass filter so that the harmonic components included in the output of the amplifying means can be removed, and construct a resonance circuit so that the frequency selectivity Q is improved and then the signal-to-noise ratio can be improved.

25 Claims, 19 Drawing Sheets

HIGH-FREQUENCY OSCILLATION CIRCUIT

BACKGROUND OF INVENTION

1. Field of the Invention

This invention relates to a oscillation circuit suitable for high-frequency oscillation, and particularly to a high-frequency oscillation circuit having a feedback loop which can be used for a high frequency circuit of communication equipment and the like to improve a frequency and amplitude characteristics of the oscillation signals.

2. Description of the Prior Art

In general, a high-frequency circuit used for a communication equipment such as TV, radio receiver, high-frequency radio equipment, and a high-frequency measuring instrument and the like move a signal from the base band to the high-frequency band and vice verse.

For this, the high-frequency circuit mixes signals in the base band or high frequency signals with carrier signals originating from a local oscillation source. This local oscillation source comprises colpitts oscillator, Hartley oscillator, clap oscillator, or other oscillators modified from the above.

However, since the oscillators in the conventional art generate harmonic components in the oscillation signal, an additional band pass filter or band stop amplifier in the oscillators is necessary to reduce the harmonic components. In addition, since the oscillators in the conventional art include numerous harmonic components in the oscillation signal, a filter circuit has to be included in the oscillator in order to reduce the spurious and it is difficult to design a broadband pass amplifier. Further, the harmonic components in the oscillating signals give considerable burden to the receiving circuit, since which cause problems of image signals in the receiving circuit. Furthermore, there are many problems, such as the increase of loss of signals, circuit complexity, and manufacturing cost.

A conventional high-frequency oscillation circuit is shown in FIG. 1. Referring to FIG. 1, the high-frequency oscillation circuit are composed of a resonance circuit part 10 and an oscillation circuit part 20, and the resonance circuit part 10 and the oscillation circuit part 20 are connected each other by a coupling capacitor 16. The resonance part 10 is composed of an inductor 12 and a capacitor 14. The oscillation circuit part 20 includes a bipolar transistor 22, a resistor 24 and a capacitor 26 connected in parallel between the emitter and ground of the bipolar transistor 22, and a capacitor 28 connected between the emitter and the base of the bipolar transistor 22. A power source 30 is connected to the base and collector of the bipolar transistor 22 through the resistors 32 and 34 which are connected in parallel.

Wherein, the capacitor 16 is placed between the resonance circuit part 10 and the oscillation circuit part 20 and passes alternating signals only. The bipolar transistor 22 is driven by the voltage which is applied through the resistor 32 from the voltage source 30. The resistor 32 is a bias resistor of the bipolar transistor 22 and regulates the voltage value supplied to the base of the bipolar transistor 22. The resistor 34 functions as a load resistor of the bipolar transistor 22.

The resistor 24 of the oscillation circuit part 20 is connected to the emitter of the bipolar transistor 22 and limits the quantity of the current flowing on the emitter of the bipolar transistor 22. The capacitor 26 bypasses the high-frequency noise signal and matches the impedances of the base and the emitter of the bipolar transistor 22. The capacitor 28 feed back the signal originating from the emitter of the bipolar transistor 22 into the base thereof. The capacitors 26 and 28 set up the phase condition of the oscillation circuit.

In the conventional high-frequency oscillation circuit having such a construction, the oscillation frequency is determined by the unique resonance frequency of the resonance circuit part 10, the capacitances of the capacitors 26 and 28, and the inner capacitance value of the bipolar transistor 22.

However, the capacitors 26 and 28 used in the conventional oscillation circuit have a problem that the gain of the feedback loop 20 cannot be enlarged because of the restriction on the composition due to the of phase condition of the oscillation circuit. Accordingly, the oscillation circuit of the conventional art has to use a transistor having high cutoff frequency, and the resulting oscillation signal includes numerous harmonic components. Therefore, the oscillation circuit of the conventional art has the problem that band pass filter, band stop amplifier and the like have to be added thereto.

SUMMARY OF INVENTION

Therefore, an object of the present invention is to provide a high-frequency oscillation circuit in which harmonic components of a oscillation signal can be reduced.

Another object of the present invention is to provide a high-frequency oscillation circuit capable of enhancing the frequency characteristics of the oscillating signals.

Another object of the present invention is to provide a high-frequency oscillation circuit in which manufacturing cost can be reduced.

Another object of the present invention is to manufacture a high-frequency oscillation circuit as a monolithic circuit with ease.

Another object of the present invention is to construct an oscillator in which C/N ratio and the oscillation level are high simultaneously.

To achieve the objects of the present invention, a high-frequency oscillation circuit having a feedback loop according to the present invention comprises: resonance means for generating oscillation frequency signals; amplifying means having an input port for receiving the signals originating from the resonance means and for amplifying the signals originating from the resonance means; an inductive element having one port connected to the output port of the amplifying means; and a capacitive element having one port connected to the other port of the inductive element; wherein the connection point of the inductive element and the capacitive element is connected to the input port of the amplifying means.

Also, to achieve the objects of the present invention, a high-frequency oscillation circuit according to the present invention comprises: resonance means for generating oscillation frequency signals; amplifying means having an input port for receiving the signals originating from the resonance means and for amplifying the signals originating from the resonance means; a T-shaped matching element having one port connected to the output port of the amplifying means; and a capacitive element having one port connected to the other port of the T-shaped matching element; wherein the other port of the capacitive element is grounded, wherein the connection point of the T-shaped matching element and the capacitive element is connected to the input port of the amplifying means.

Also, to achieve the objects of the present invention, in a high-frequency oscillation circuit according to the present invention, the inductive element or the T-shaped matching element forms a part of the feedback loop which feeds back the output signal originating from the output port of the amplifying means into the input terminal, and the inductive element or T-shaped matching element and capacitor compose an impedance matching means for matching the impedances of both ports of the feedback loop, and the gain of the oscillation signal is maximized, and the impedance matching means forms the resonance circuit and the low pass filter.

Also, to achieve the objects of the present invention, a high-frequency oscillation circuit according to the present invention comprises: resonance means for generating oscillation frequency signals; amplifying means having an input port for receiving the signals originating from the resonance means and for amplifying the signals originating from the resonance means; a strip line having one port connected to the output port of the amplifying means; and a capacitive element having one port connected to said one port of the strip line, wherein the other port of the capacitive element is grounded, wherein the other port of the strip line is connected to the input port of the amplifying means.

Now, preferred embodiments of the high-frequency oscillation circuit in accordance with the present invention will be described with reference to accompanying drawings.

The present invention will not be limited to the embodiments described below, and many modifications can be performed within the same field of the technology.

BRIEF DESCRIPTION OF DRAWINGS

The foregoing and other objects, features, and advantages of the invention will be apparent from the following more particular description of the preferred embodiments as illustrated in the accompanying drawings.

DETAILED DESCRIPTION

The high-frequency circuit in accordance with the present invention includes a resonance circuit part 10 and an oscillation circuit part 20 both of them are applied to the conventional high-frequency circuit and forms another resonance circuit in the oscillation circuit part 20, so that the frequency selectivity Q is increased and the signal-to-noise ratio can be improved. The harmonic components included in the emitter output signal can be removed by constructing low pass filter in the high-frequency circuit in accordance with the present invention.

The operations of the high-frequency oscillation circuit in accordance with the present invention will be described with reference to FIG. 3 as follows.

Figure 1:
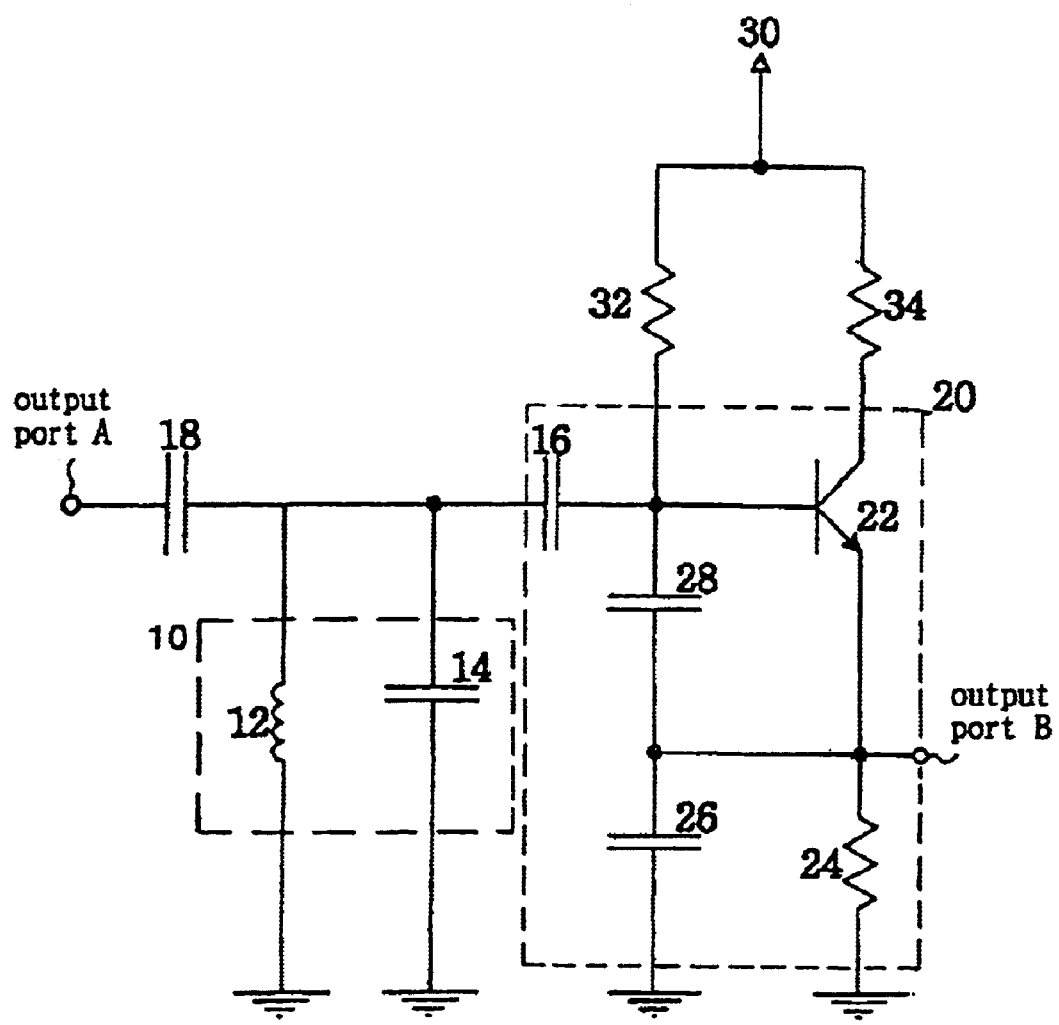
FIG. 1 shows a conventional high-frequency oscillation circuit.
Figure 3:
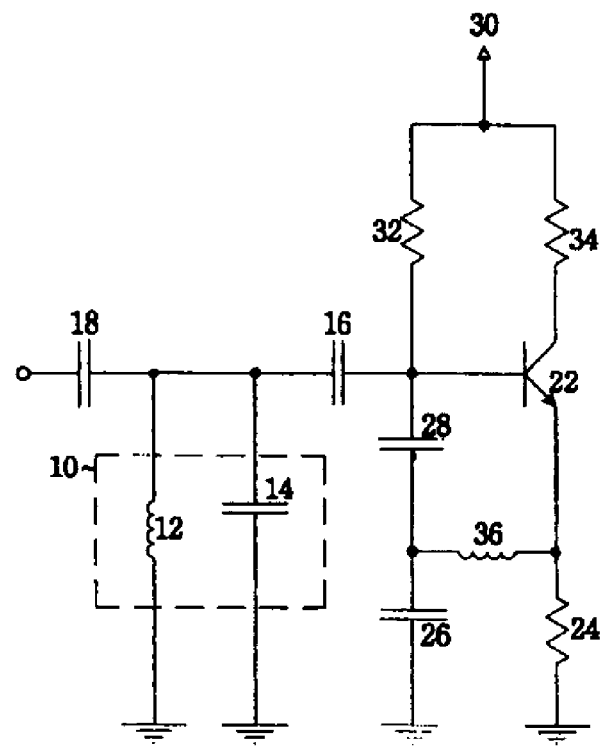
FIG. 3 shows a high-frequency oscillation circuit in accordance with an embodiment of the present invention.

The reference numerals of the constitutional elements shown in FIG. 3 are used as those of FIG. 1 when they are the same ones as those of conventional high-frequency oscillation circuit.

Accordingly, the description in FIG. 1 is omitted to make the description simple.

Referring to FIG. 3, the high-frequency oscillation circuit further includes an inductor 36 connected to the emitter of the bipolar transistor 22. The inductor 36 and capacitor 28 form a feedback loop which feeds back a signal originating from the bipolar transistor 22 into the base. This feedback loop makes the bipolar transistor 22 to be oscillated by forward feeding back the emitter output signal of the bipolar transistor 22 into the base. The impedance matching between the base and emitter of the bipolar transistor 22 can be achieved by the inductor 36 and the capacitor 26. In case that the impedances of base and emitter of the bipolar transistor 22 are matched, the gain of the feedback loop is increased and high level oscillation signal can be obtained.

The inductor 36 and capacitor 26 form a serial resonance circuit to match the impedances of the base and emitter of the bipolar transistor 22, at the same time, form a low pass filter to remove the harmonic component included in the emitter output signal. The serial resonance circuit forms with the resonance circuit part 10 a double-resonance circuit to improve the frequency selectivity of the oscillation circuit and maintain the high signal-to-noise ratio.

On the other hand, the low pass filter consisted of the inductor 36 and capacitor 26 bypass the harmonic wave components higher than its cutoff frequency among the emitter output signals of the bipolar transistor 22 toward the ground so that only the resonance frequency component is returned to a base of the bipolar transistor 22. It is desirable that the cutoff frequency of the low pass filter is set lower than the frequency of the secondary harmonic wave to remove all of the harmonic wave component including the secondary and higher harmonic wave components.

Furthermore, a high-frequency oscillation circuit comprises a resonance circuit part 10 and a capacitor 18 connected between a coupling capacitor 16 and an output port. The capacitor 18 cutoffs noise signals of direct current component while transmitting only oscillation signals to the output port.

Optionally, the bipolar transistor 22 in the preferred embodiment can be replaced with a field effect transistor and, even in the case of the replacement, can obtain the same effect.

Also, optionally, it is possible to optimize the low pass filter consisted of the capacitor 26 and the inductor 36 for a wide band of variable frequency width by replacing the capacitor 26 with a voltage controlled variable capacitance diode.

Figure 4:
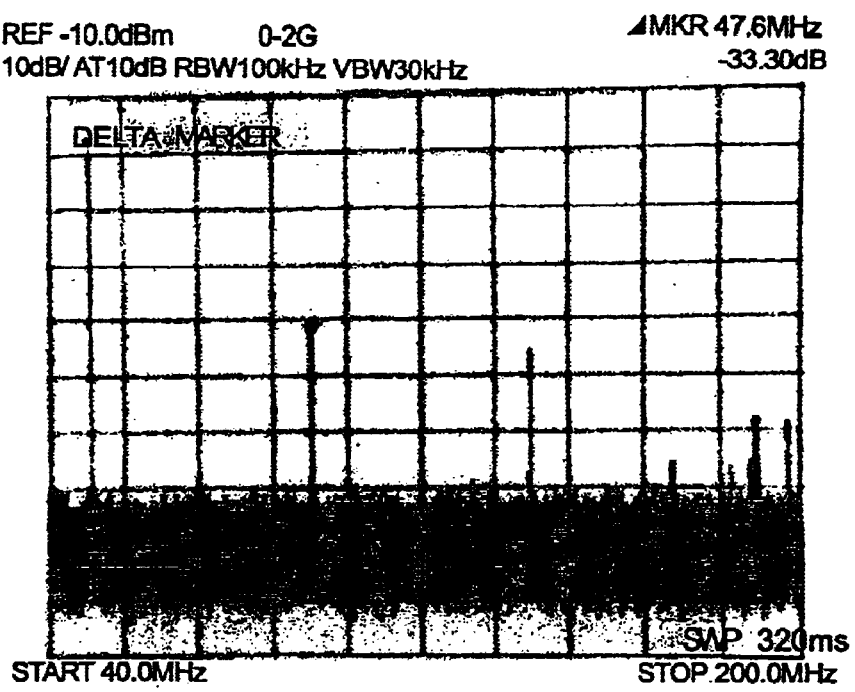
FIG. 4 shows an output spectrum of the high-frequency circuit in accordance with the present invention illustrated in FIG. 3.

FIG. 4 shows an output spectrum of the high-frequency oscillation circuit according to the first embodiment of the invention disclosed in the FIG. 3, where the inductor 12 is 330 nH, the capacitor 16 is 33 pF, the capacitor 18 is 3 pF, the resistance 24 is 820 Ω, the capacitors (26, 28) is 15 pF, the resistance 32 is 100 KΩ, the resistance 34 is 200 Ω, and the inductor 36 is 100 nH, and shows an output spectrum measured using a sweep time 320 ms between a measurement starting frequency 40 MHz and a measurement ending frequency 200 MHz in the case where the capacitor 14 is HUV 359 the transistor 22 is 2SC4649. Here, a unit of every interval of the longitudinal axis is 10 dB.

Considering of the result of the output spectrum shown in the FIG. 4, it can be understood that the frequency of the first harmonic wave being the oscillation signal is 47.6 MHz and the frequency of the secondary harmonic wave being a spurious wave is 95.2 MHz. Furthermore, reviewing of the FIG. 4, it can be seen that the difference of the signal strength between the oscillation signal and the spurious wave is 33.30 dB.

FIG. 2 shows an output spectrum in the case of using the same parts as ones used to obtain the output spectrum of the FIG. 4 as the output spectrum of the conventional high-frequency oscillation circuit shown in the FIG. 1.

Figure 2A:
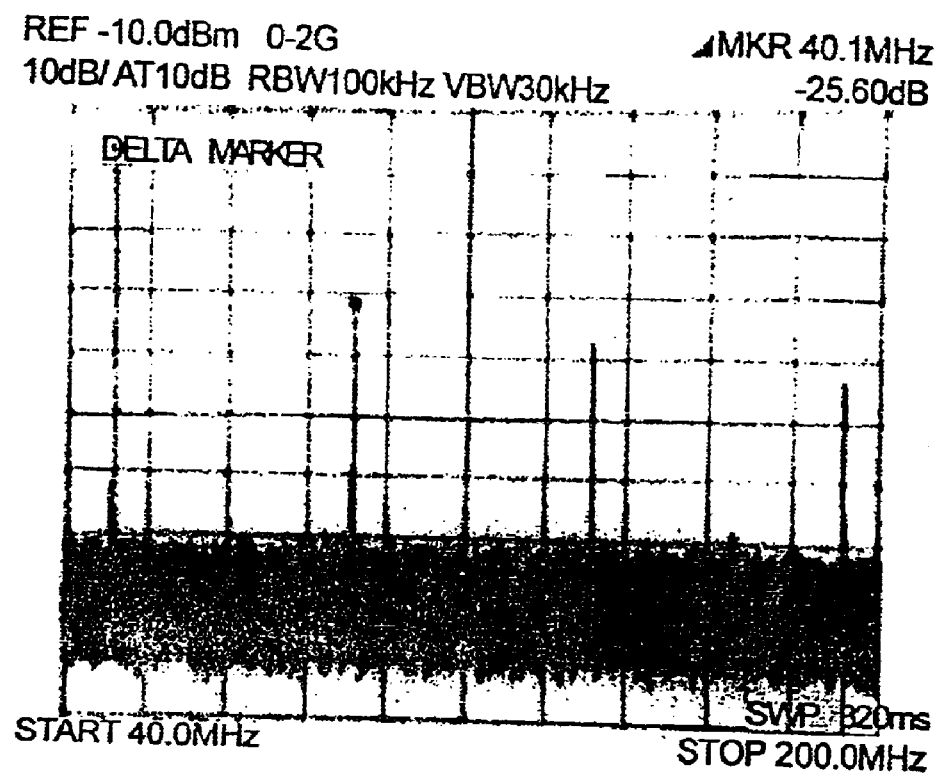
FIG. 2(a) shows an output spectrum at the output port a of the conventional high-frequency oscillation circuit illustrated in FIG. 1.
Figure 2B:
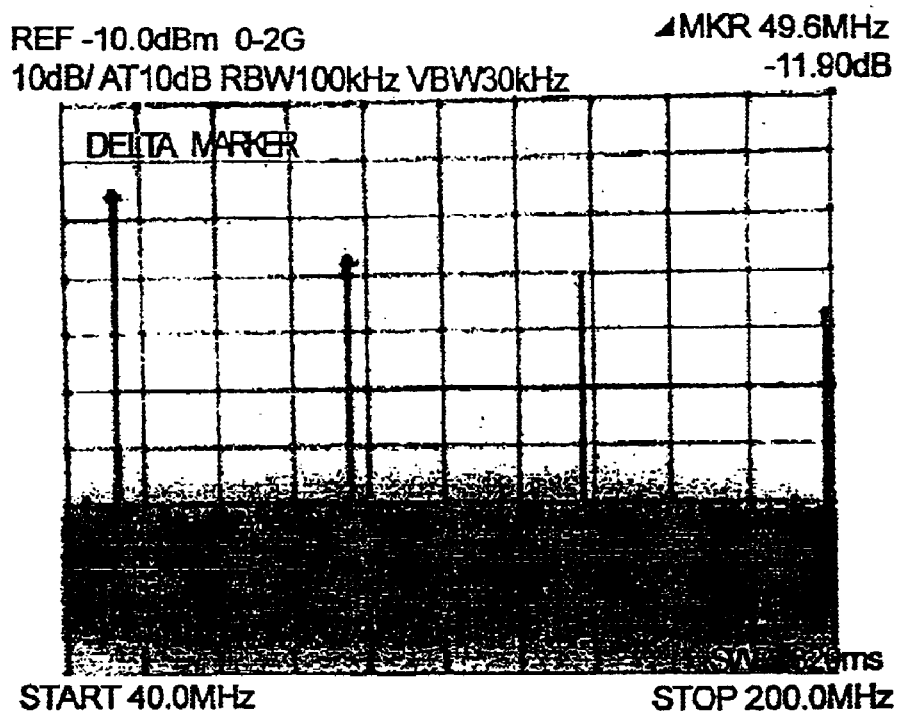
FIG. 2(b) shows an output spectrum at the output port b of the conventional high-frequency oscillation circuit illustrated in FIG. 1.

FIG. 2(a) shows an output spectrum at the output port A of the high-frequency oscillation circuit shown in the FIG. 1, which shows that the signal strength between the first harmonic wave being the oscillation signal and the secondary harmonic wave being the spurious wave is 25.60 dB. FIG. 2(b) shows the output spectrum at the output port B of the high-frequency oscillation circuit shown in the FIG. 1, which shows that the signal strength between the first harmonic wave being the oscillation signal and the second harmonic wave being the spurious wave is 11.60 dB.

From the above-description, it will be understood that the high-frequency oscillation circuit according to the invention can significantly enhance the harmonic wave component remove property over the conventional high-frequency oscillation circuit.

Figure 5:
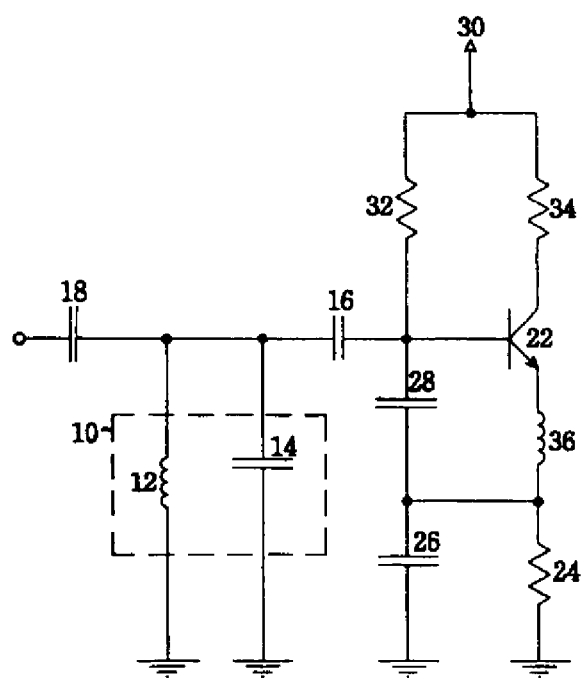
FIG. 5 shows a high-frequency oscillation circuit in accordance with another embodiment of the present invention.

FIG. 5 shows a high-frequency oscillation circuit according to another embodiment of the invention. Referring to FIG. 5, the high-frequency oscillation circuit further comprises the inductor 36 connected between the emitter of the bipolar transistor 22 and the resistance 24. The inductor 36 along with the resistance 24 serves as a reactance element. The inductor 36 and the capacitor 28 form a feedback loop for returning the signal from the emitter of the bipolar transistor 22 toward the base. The feedback loop makes positive-feedback the emitter output signal of the bipolar transistor 22 toward the base so that the bipolar transistor 22 is oscillated. The impedance matching between the emitter and the base of the bipolar transistor 22 is performed by the reactance element and the capacitor 26. In the case where the impedances of the base and the emitter of the bipolar transistor 22 are matched, the gain of the feedback loop is increased and the oscillation signal of the high level is obtained. The reactance element and the capacitor 26 constitutes a series resonance circuit to match the base impedance of the bipolar transistor 22 with the emitter impedance of the bipolar transistor 22 and at the same time, constitutes the low pass filter to remove the harmonic wave components included in the emitter output signal. The series resonance circuit forms a double resonance circuit along with a resonance circuit part 10 to enhance the frequency selectivity of the oscillation circuit and maintain high signal-to-noise ratio.

On the other hand, the low pass filter consisted of the reactance element and the capacitor 26 bypasses the harmonic wave component higher than its cutoff frequency among the emitter output signals of the bipolar transistor 22 toward the ground so that only the resonance frequency component is returned to the base of the bipolar transistor 22. Then, it is desirable that the cutoff frequency of the low pass filter sets less than the frequency of the secondary harmonic wave to remove all of the harmonic wave component including the secondary or higher harmonic wave component.

It can obtain from a high-frequency oscillation circuit of the invention shown in the FIG. 5 the same result as the output spectrum of the high-frequency oscillation circuit shown in FIG. 3.

Figure 6:
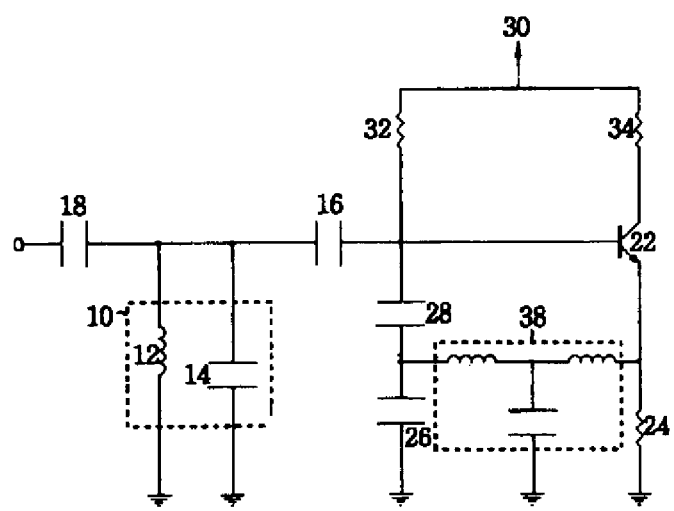
FIG. 6 shows a high-frequency oscillation circuit in accordance with another embodiment of the present invention.

FIG. 6 shows a high-frequency oscillation circuit of another embodiment according to the invention. Referring to FIG. 6, the high-frequency oscillation circuit includes a T-shape matching circuit 38 connected between the emitter and the capacitor 28 of the bipolar transistor 22. The T-shape matching circuit 38 operates as an inductive reactance element consisted of two inductors and one capacitor. The inductive reactance element 38 and the capacitor 28 form a feedback loop for returning the signal from the emitter of the bipolar transistor 22 toward the base. The feedback loop makes positive-feedback the emitter output signal of the bipolar transistor 22 toward the base so that the bipolar transistor 22 is oscillated. The impedance matching between the emitter and the base of the bipolar transistor 22 is performed by the inductive reactance element 38 and the capacitor 26. In the case where the impedances of the base and the emitter of the bipolar transistor 22 are matched, the gain of the feedback loop is increased and the oscillation signal of the high level is obtained.

The inductive reactance element 38 and the capacitor 26 constitutes a series resonance circuit to match the base impedance of the bipolar transistor 22 with the emitter impedance of the bipolar transistor 22 and, at the same time, constitutes the low pass filter to remove the harmonic wave components included in the emitter output signal. Furthermore, The series resonance circuit forms the double resonance circuit along with a resonance circuit part 10 to enhance the frequency selectivity of the oscillation circuit and maintain high signal-to-noise ratio.

On the other hand, the low pass filter consisted of the T-shape matching circuit 38 and the capacitor 26 bypasses the harmonic wave component higher than its cutoff frequency among the emitter output signals of the bipolar transistor 22 toward the ground so that only the resonance frequency component is returned to the base of the bipolar transistor 22. Then, it is desirable that the cutoff frequency of the low pass filter sets less than the frequency of the secondary harmonic wave to remove all of the harmonic wave component including the secondary or higher harmonic wave component.

Optionally, the bipolar transistor 22 in the preferred embodiment can be replaced with a field effect transistor and, even in the case of the replacement, can obtain the same effect.

Furthermore, optionally, it is possible to optimize the low pass filter consisted of the capacitor 26 and the T-shape matching circuit 38 for a wide band of variable frequency width by using the voltage controlled variable capacitance diode substituting for the capacitor 26 and the capacitor of the T-shape matching circuit 38.

Figure 7:
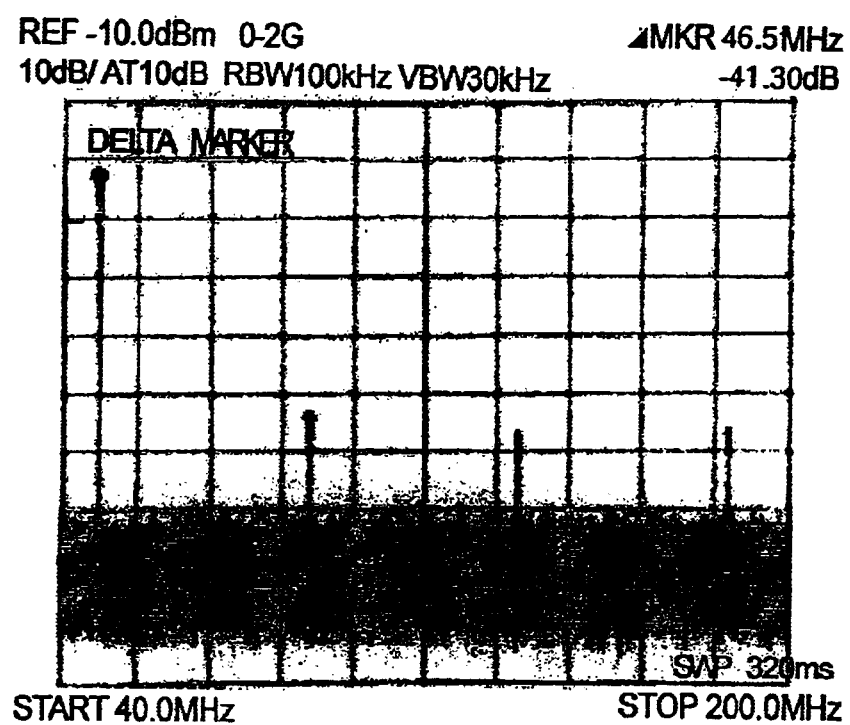
FIG. 7 shows an output spectrum of the high-frequency circuit in accordance with the present invention illustrated in FIG. 6.

FIG. 7 shows that an element common with the high-frequency oscillation circuit of FIG. 3 uses the same element when obtaining an output spectrum of FIG. 4 as showing an output spectrum of the high-frequency oscillation circuit according to the invention shown in the FIG. 6, and shows the results in the case where the inductor of T-shape matching circuit 38 is 100 nH, the capacitor is 10 pF, and the capacitor 18 is 3 pF. Referring to FIG. 7, it can be seen that the difference between the first harmonic wave being the oscillation signal and the secondary harmonic wave being the spurious wave is 41.30 dB. That is, it can be seen that it has an remarkable harmonic wave component remove property over 25.60 dB-11.90 Db in the output spectrum of the conventional high-frequency oscillation circuit.

Figure 8:
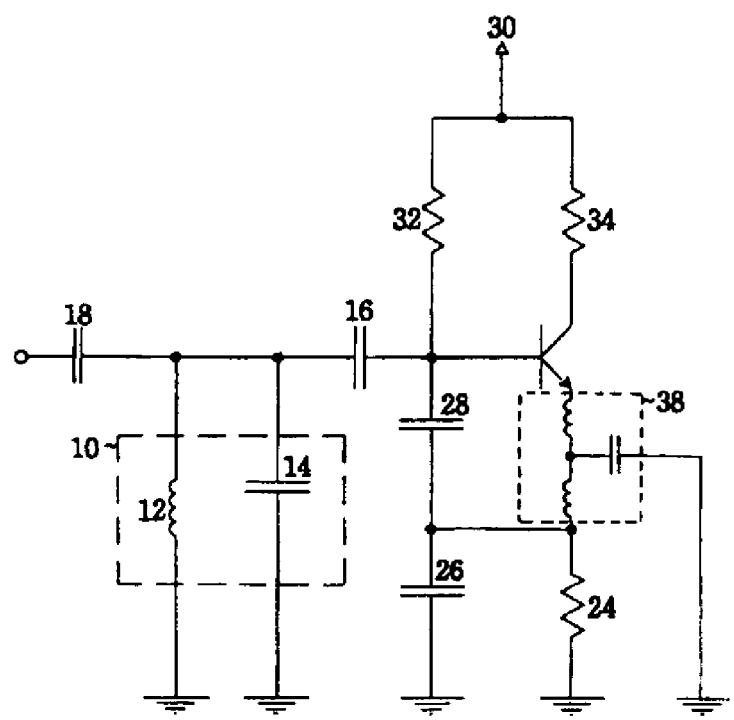
FIG. 8 shows a high-frequency oscillation circuit in accordance with another embodiment of the present invention.

FIG. 8 shows a high-frequency oscillation circuit according to another embodiment of the invention. Referring to FIG. 8, the high-frequency oscillation circuit comprises a T-shape matching circuit 38 connected between the emitter of the bipolar transistor 22 and the resistance 24. The T-shape matching circuit 38 is consisted of two inductors and one capacitor and serves as one reactance element along with the resistance 24. The T-shape matching circuit 38 and the capacitor forms a feedback loop for returning signal from the emitter of the bipolar transistor 22 toward the base. The feedback loop makes positive-feedback the emitter output signal of the bipolar transistor 22 toward the base so that the bipolar transistor 22 is oscillated. The impedance matching between the emitter and the base of the bipolar transistor 22 is performed by the reactance element and the capacitor 26. In the case where the impedances of the base and the emitter of the bipolar transistor 22 are matched, the gain of the feedback loop is increased and the oscillation signal of the high level is obtained.

The reactance element and the capacitor 26 constitutes a series resonance circuit to match the base impedance of the bipolar transistor 22 with the emitter impedance of the bipolar transistor 22 and at the same time, constitutes the low pass filter to remove the harmonic wave components included in the emitter output signal. The series resonance circuit forms a double resonance circuit along with a resonance circuit 10 to enhance the frequency selectivity of the oscillation circuit and maintain high signal-to-noise ratio.

On the other hand, the low pass filter consisted of the reactance element and the capacitor 26 bypasses the harmonic wave component higher than its cutoff frequency among the emitter output signals of the bipolar transistor 22 toward the ground so that only the resonance frequency component is returned to the base of the bipolar transistor 22. Then, it is desirable that the cutoff frequency of the low pass filter sets less than the frequency of the secondary harmonic wave to remove all of the harmonic wave component including the secondary or higher harmonic wave component.

Furthermore, optionally, it is possible to optimize the low pass filter consisted of the capacitor 26 and the T-shape matching circuit 38 for a wide band of variable frequency width by using the voltage controlled variable capacitance diode substituting for the capacitor 26 and the capacitor of the T-shape matching circuit 38.

Even in the oscillation circuit disclosed in the FIG. 8, it can obtain the same result as the output spectrum in the FIG. 7.

Figure 9:
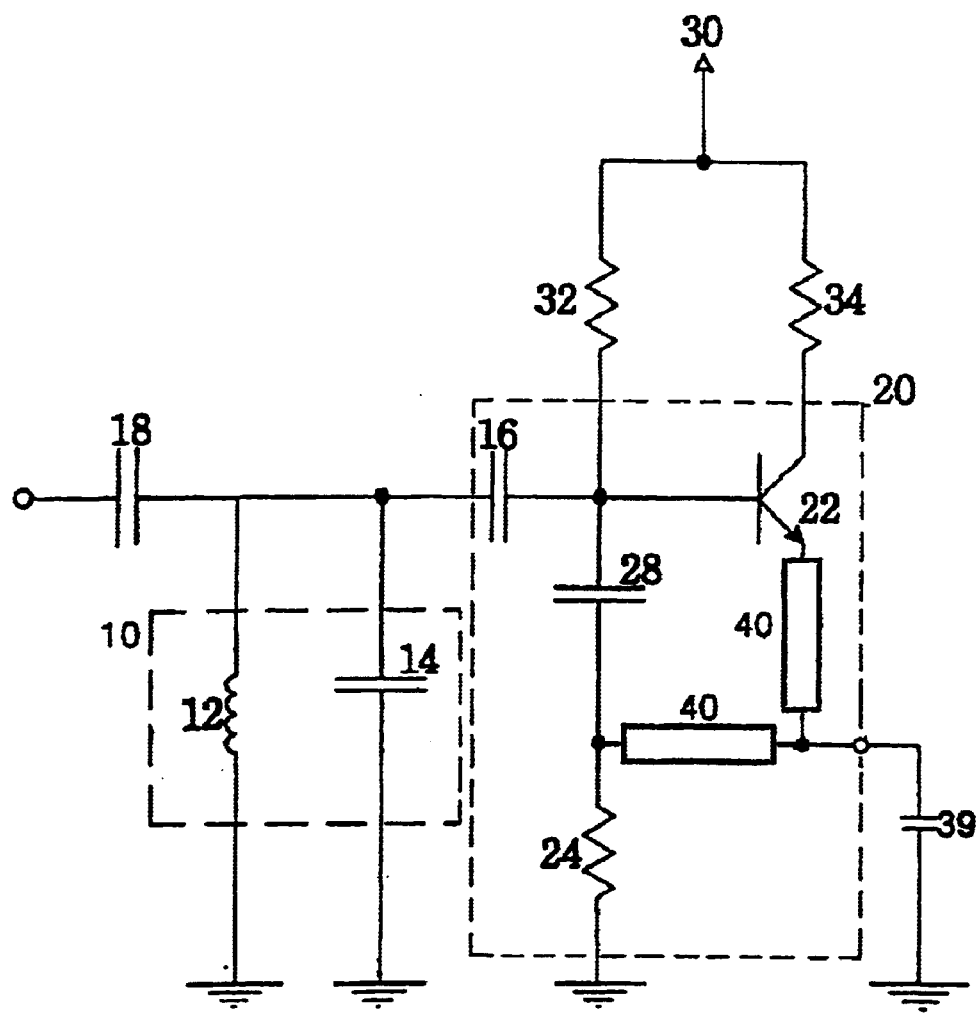
FIG. 9 shows a high-frequency oscillation circuit in accordance with another embodiment of the present invention.
Figure 10A:
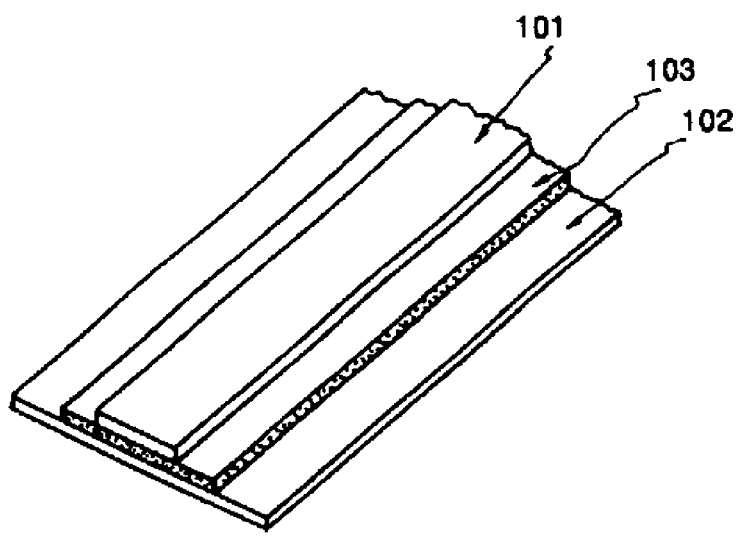
FIG. 10(a) is a partial perspective view of the strip line, which can be employed in the present invention illustrated in FIG. 9.
Figure 10B:
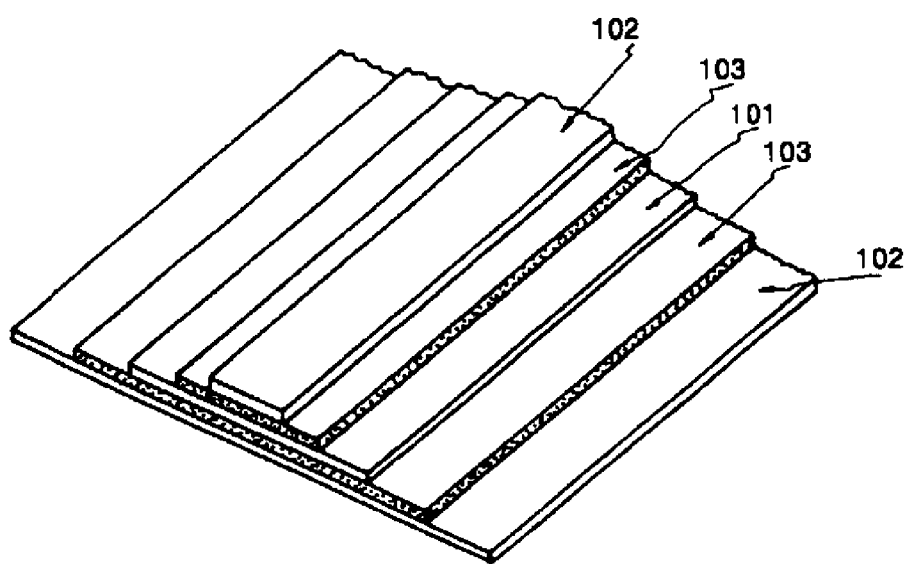
FIG. 10(b) is a partial perspective view of another strip line, which can be employed in the present invention illustrated in FIG. 9.

FIG. 9 shows an embodiment of the invention about a high-frequency oscillation circuit adopting a strip line that is a kind of a transmission line for microwave as a constitution element. Generally, the strip line is typically constituted as shown in the FIG. 10(*a*) as the microwave transmission line consisted of a strip shape of conductor that is disposed on a wide conductive plane or in the middle of two planes. In the FIG. 10(*a*), a strip conductor 101 is isolated from a conductor 102 faced thereto or a ground by a low loss of dielectric substance 103. The strip conductor 101 is printed on the dielectric substance 103 by a general print wiring technique. Optionally, as shown in the FIG. 10(*b*), one strip conductor 101 may constitutes to be sandwiched between two dielectric substances 103. In the FIG. 10(*b*), the strip conductor 10 is narrow-supported by the two dielectric substances 103. The facing conductor 103 applies the outside of each dielectric substance 103. In the strip line shown in the FIG. 10(*a*) and the FIG. 10(*b*), if signal of GHz band is inputted to an input port IN and outputted to an output port OUT, on the strip line is generated inductance and capacitance by inductance component of the strip conductor 101 and capacitance component by a dielectric constant between the strip conductor 101 and the facing conductor 102. In the case of using such a property for constituting an oscillator of GHz unit having the strip line, the low pass filter disposed in the feedback loop requires a matching capacitor due to distributed capacitance produced on the strip line route.

Hereafter, it describes a high-frequency oscillation circuit according to other embodiment of the invention with reference to FIG. 9. The high-frequency oscillation circuit of the FIG. 9 comprises a strip line 40 connected between the emitter and the capacitor 28 of the bipolar transistor 22. The strip line 40 operates in GHz band as an inductive reactance element consisted of one inductor and one capacitor. The inductive reactance element 40 and the capacitor 28 form a feedback loop for returning signal the emitter of the bipolar transistor 22 toward the base. The feedback loop makes positive-feedback the emitter output signal of the bipolar transistor 22 so that the bipolar transistor 22 is oscillated. The impedance matching between the emitter and the base of the bipolar transistor 22 is performed by a capacitor 39 connected to an inductive reactance element 40 and one end portion of the inductive reactance element 40. In the case where the impedances of the base and the emitter of the bipolar transistor 22 are matched, the gain of the feedback loop is increased and the oscillation signal of high level is obtained.

The strip line 40 being the inductive reactance element and the capacitor 26 constitutes a series resonance circuit to match the base impedance of the bipolar transistor 22 with the emitter impedance of the bipolar transistor 22 and at the same time, constitutes the low pass filter to remove the harmonic wave components included in the emitter output signal. The strip line 40 and capacitor 39 are needed to set to trap the second harmonic frequency, then, it will work as a trapping circuit for trapping the second harmonic waves.

Figure 11:
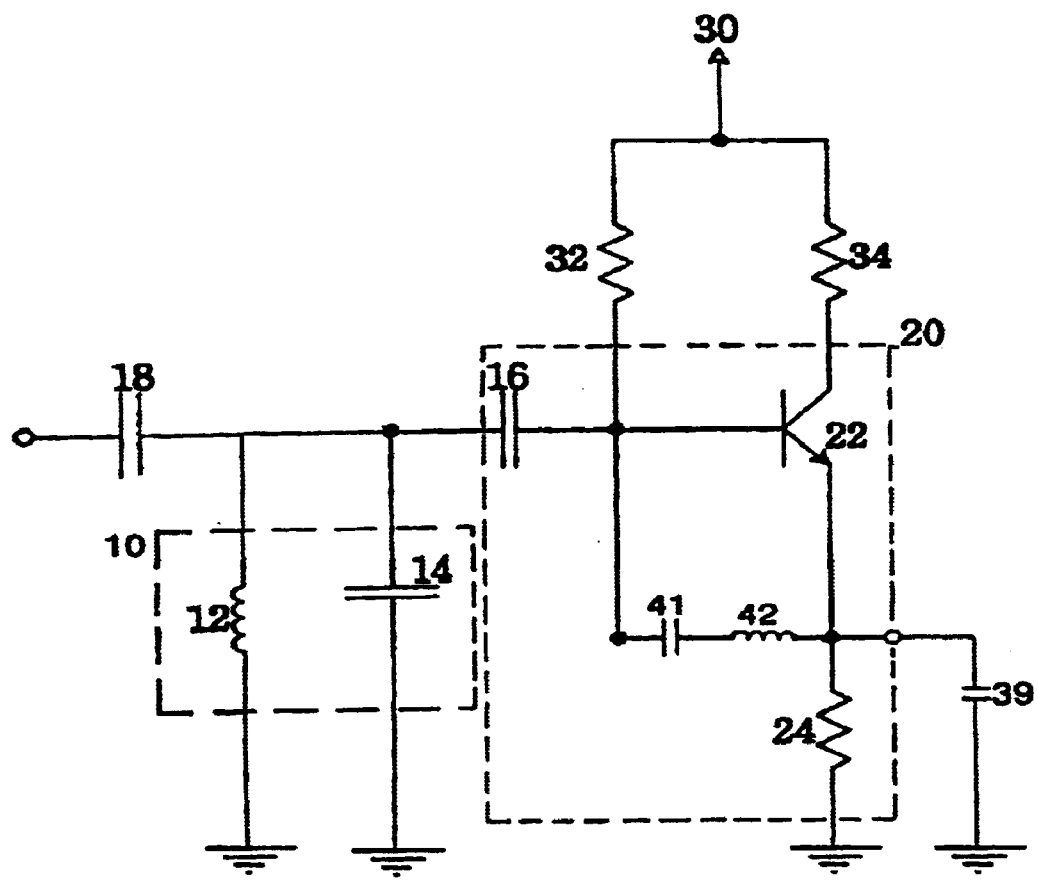
FIG. 11 shows an equivalent circuit of the high-frequency oscillation circuit shown in FIG. 9 in the region of GHz band.

Also, the series resonance circuit forms a double resonance circuit along with a resonance circuit part 10 to enhance the frequency selectivity of the oscillation circuit and maintain high signal-to-noise ratio. FIG. 11 illiterately shows the equivalent with the high-frequency oscillation circuit shown in the FIG. 9 for signal of GHz band.

On the other hand, the low pass filter consisted of the strip line 40 and the capacitor 26 bypasses the harmonic wave component higher than its cutoff frequency among the emitter output signals of the bipolar transistor 22 toward the ground so that only the resonance frequency component is returned to the base of the bipolar transistor 22. Then, it is desirable that the cutoff frequency of the low pass filter sets less than the frequency of the secondary harmonic wave to remove all of the harmonic wave component including the secondary or higher harmonic wave component.

Optionally, the bipolar transistor 22 of the preferred embodiment can be replaced with a field effect transistor (FET), and, even in the case of the replacement, can obtain the same effect.

Furthermore, optionally, it is possible to optimize the low pass filter consisted of the capacitor 39 and the strip line 40 for a wide band of variable frequency width by using the voltage controlled variable capacitance diode substituting for the capacitor 39.

As described above, the high-frequency oscillation circuit of the invention adds a simple circuit to an existing oscillation circuit to match the input side impedance of the feedback loop with the output side impedance of it to enhance the gain of the feedback loop and raise the oscillation level, and at the same time, adds the low pass filtering function to the feedback loop to prohibit the generation of the harmonic wave component and enhance the signal-to-noise ratio.

As a result, the high-frequency oscillation circuit of the invention can obtain the effect such as compacting the high performance of the oscillation circuit while reducing the cost of production without appending supplement circuits such as a band pass filter and a band stop amplifier, etc individually required to a conventional the high-frequency circuit.

Figure 12:
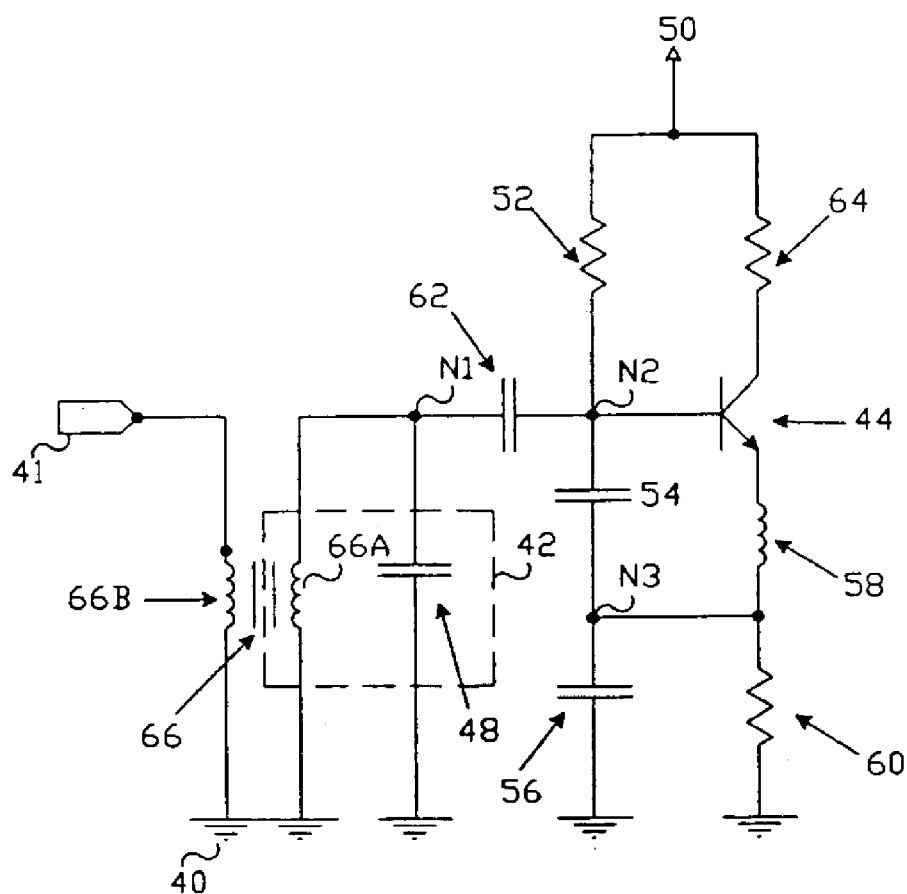
FIG. 12 is a circuit diagram of a high frequency oscillating apparatus in accordance with another embodiment of the present invention.

Referring to FIG. 12, there is shown a high frequency oscillating apparatus according to the third embodiment of the present invention which comprises a transformer 66 connected among a first node N1, an output line 41 and a first voltage source 40, and a bipolar transistor 44 having a base connected to a second node N2. The primary coil 66A of the transformer 66 is connected between the first node N1 and the first voltage source 40 to derive an oscillation signal on the first node N1 at the secondary coil 66. Also, the primary coil 66A of the transformer 66 configures a resonator 44 that serve to function as pulsation means along with a first capacitor 48. On the other hand, the secondary coil 66B of the transformer 66 connected between the output line 41 and the first voltage source 40 sends the oscillation signal derived from the primary coil 66A to the secondary coil 66B of the transformer 66 has such a magnitude that the oscillation signal on the first node N1 is voltage transformed in accordance with a winding ratio of the secondary coil 66B relative to the primary coil 66A. The bipolar transistor 44 is derived by a voltage applied via a first resistor 52 and a second node N2 from a second voltage source 50. The first resistor 52 is a bias resistance of the bipolar transistor 44, which controls a value of the voltage supplied with the base of the bipolar transistor 44.

Further, the high frequency oscillating apparatus comprises a second capacitor 54 connected between the second node N2 and a third node N3, a parallel connection of a third capacitor 56 and a second resistor 60 between the third node N3 and the first voltage source 40, and a second inductor 58 connected between an emitter of the bipolar transistor 44 and the third node N3. The second inductor 58 serves to function as a single reactance device along with the second the second resistor 60. The second resistor 60 limits an amount of the current going through the emitter of the bipolar transistor 44. The second capacitor 54 and the second inductor 58 provides a feedback loop for feeding back an emitter output signal of the transistor 44 via the second node N2 into the base thereof. This feedback loop makes a positive feedback of the emitter of the bipolar transistor 44 into the base thereof to oscillate the transistor 44. A gain of this feedback loop increases in the time of an impedance matching between the base and the emitter of the bipolar transistor 44 to obtain a high level of oscillation signal. The impedance matching between the base and the emitter of the bipolar transistor 44 is accomplished by reactance device and the third capacitor 56 configures a serial resonance circuit to match the impedance in the base of the transistor 44 with that in the emitter thereof, and at the same time configures a low pass filter to eliminate a harmonic component contained in the emitter output signal of the transistor 44. This serial resonance circuit forms a dual resonator along with the resonance circuit forms a dual resonator along with the resonance circuit forms a dual resonator along with the resonator 42 in order to enhance a frequency selectivity Q of the oscillating apparatus and also permit the oscillating apparatus to maintain a high signal-to-noise ratio. On the other hand, the low pass filter bypasses toward the first voltage source 40 higher harmonic components than the cutoff frequency thereof in the emitter output signal of the component contained into the base of the bipolar transistor 44. The cutoff frequency of the low pass filter is set to a less frequency than a second harmonic in such a manner that the second harmonic as well as the higher order harmonics are eliminated entirely.

Furthermore, the high frequency oscillating apparatus comprises a fourth capacitor 62 connected between the first node N1 and the second node N2, and a third resistor 64 connected between the second voltage source 50 and the collector of the bipolar transistor 44. The fourth capacitor 62 allows only an alternate current to be delivered between the first node N1 and the second node N2. The third resistor 64 is used as a load resistance of the bipolar transistor 44. The first voltage source 40 generates a ground voltage while the second voltage source 50 generates a certain level voltage.

Figure 13:
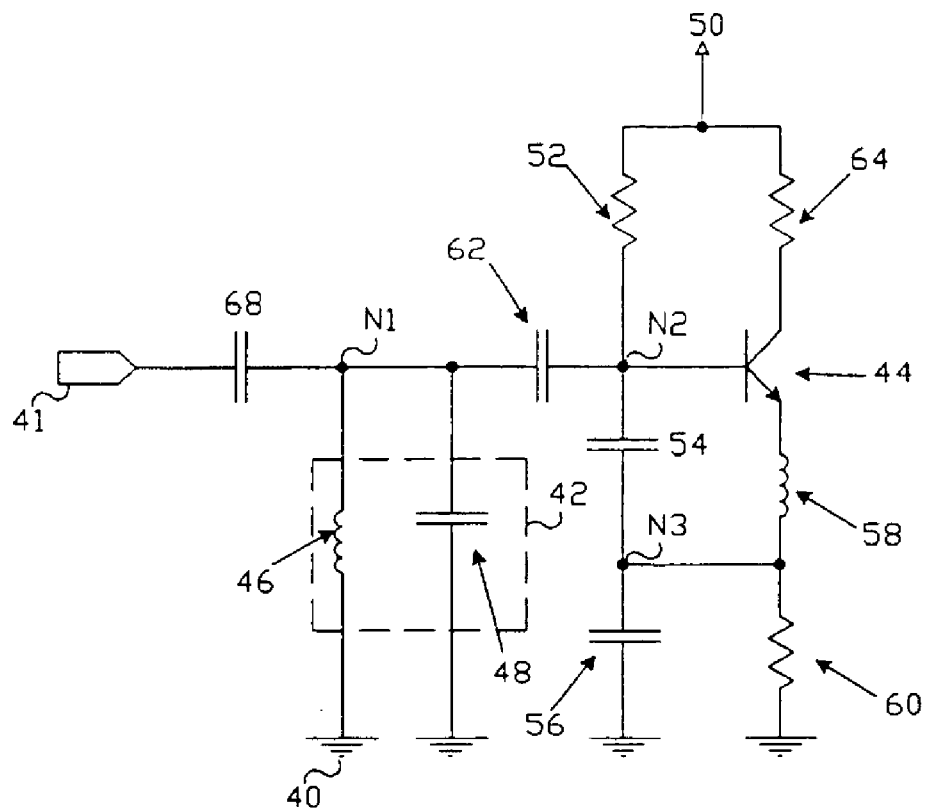
FIG. 13 is a circuit diagram of a high frequency oscillating apparatus in accordance with another embodiment of the present invention.

Referring to FIG. 13, there is shown a high frequency oscillating apparatus according to the fourth embodiment of the present invention which comprises a resonator 42 connected between the first node N1 and the first voltage source 40 and a bipolar transistor 44 having a base connected to the second node N2. The resonator 42 consists of a parallel connection of a first inductor 46 and a first capacitor 48 between the first node N1 and the first voltage source 40 in order to serve to function as s pulsation means. The bipolar transistor 44 is driven by a voltage applied via a first resistor 52 and the second node N2 from a second voltage source 50. The first resistor 52 is a bias resistor of the bipolar transistor 44, which controls a value of the voltage supplied with the base of the bipolar transistor 44.

Further, the high frequency oscillating apparatus comprises a second capacitor 54 connected between the second node N2 and a third node N3, a parallel connection of a third capacitor 56 and a second resistor 60 between the third node N3 and the first voltage source 40, and a second inductor 58 connected between an emitter of the bipolar transistor 44 and the third node N3. The second inductor 58 serves to function as a single reactance device along with the second resistor 60. The second resistor 60 limits an amount of the current going through the emitter of the bipolar transistor 44. The second capacitor 54 and the second inductor 58 provides a feedback loop for feeding back an emitter output signal of the transistor 44 via the second node N2 into the base thereof. This feedback loop makes a positive feedback of the emitter of the bipolar transistor 44 into the base thereof to oscillate the transistor 44. A gain of this feedback loop increases in the time of an impedance matching between the base and the emitter of the bipolar transistor 44 to obtain a high level of oscillation signal.

The impedance matching between the base and the emitter of the bipolar transistor 44 is accomplished by reactance device and the third capacitor 56. The reactance device and the third capacitor 56 configures a serial resonance circuit to match the impedance in the base of the transistor 44 with that in the emitter thereof; and at the same time configures a low pass filter to eliminate a harmonic component contained in the emitter output signal of the transistor 44. This serial resonance circuit forms a dual resonator along with the resonator 42 in order to enhance a frequency selectively Q of the oscillating apparatus to maintain a high signal-to-noise ratio. On the other hand, the low pass filter bypasses toward the first voltage source 40 higher harmonic components than the cutoff frequency thereof in the emitter output signal of the bipolar transistor 44 to feedback only the resonance components contained into the base of the bipolar transistor 44. The cutoff frequency of the low pass filter is set to less frequency than a second harmonic in such a manner that the second harmonic as well as the higher order harmonics is eliminated entirely.

Furthermore, the high frequency oscillating apparatus comprises a fourth capacitor 62 connected between the first node N1 and the second node N2, and a third resistor 64 connected between the second voltage source 50 and the collector of the bipolar transistor 44, and a fifth capacitor 68 connected between the first node N1 and the output line 41. The fourth capacitor 62 allows only an alternate current to be delivered between the first node N1 and the second node N2. The third resistor 64 is used as a load resistance of the bipolar transistor 44. The fifth capacitor 68 allows only the oscillation signal on the first node N1 to be delivered into output line 41, and at the same time cuts off a noise signal of direct current component. The first voltage source 40 generates a ground voltage while the second voltage source 50 generates a certain level of voltage.

Figure 14:
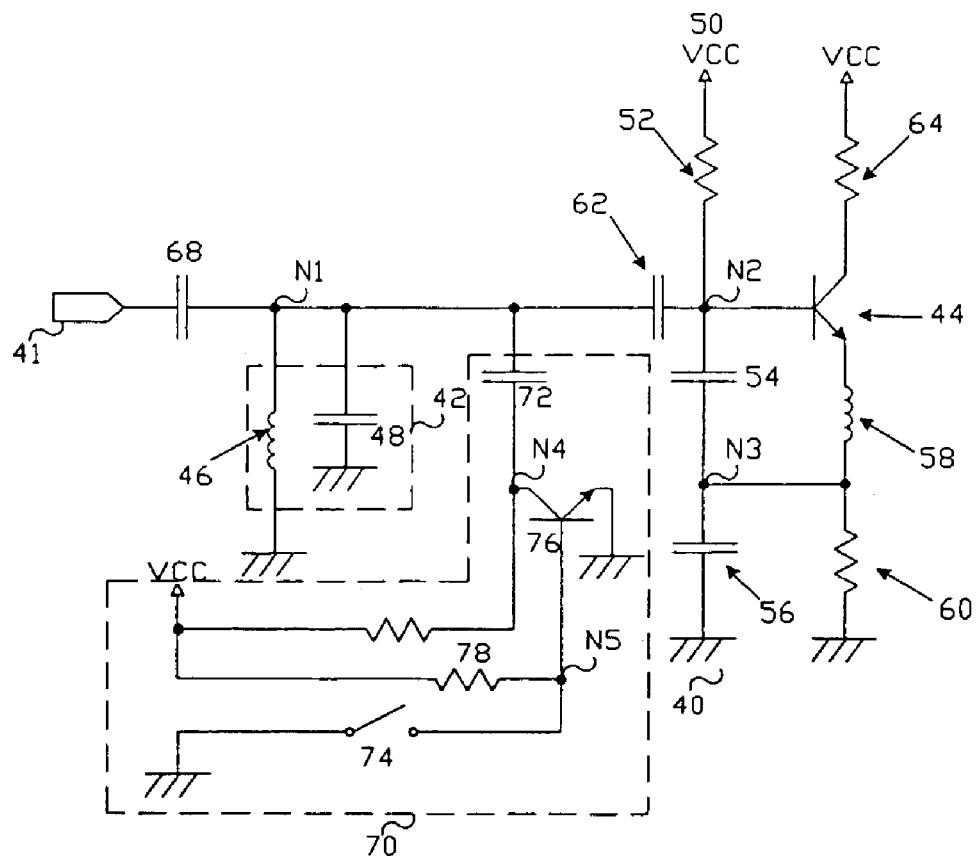
FIG. 14 is a circuit diagram of a high frequency oscillating apparatus in accordance with another embodiment of the present invention.

Referring to FIG. 14, there is shown a high frequency oscillating apparatus according to the fifth embodiment of the present invention which comprises a resonator 42 connected between the first node N1 and the first voltage source 40 and a bipolar transistor 44 having a base connected to the second node N2. The resonator 42 consists of a parallel connection of a first inductor 46 and a first capacitor 48 between the first node N1 and the first voltage source 40 in order to serve to function as s pulsation means. The first bipolar transistor 44 is drived by a voltage applied via a first resistor 52 and the second node N2 from a second voltage source 50. The first resistor 52 is a bias resistor of the bipolar transistor 44, which controls a value of the voltage supplied with the base of the first bipolar transistor 44.

Further, the high frequency oscillating apparatus comprises a second capacitor 54 connected between the second node N2 and a third node N3, a parallel connection of a third capacitor 56 and a second resistor 60 between the third node N3 and the first voltage source 40, and a second inductor 58 connected between an emitter of the first bipolar transistor 44 and the third node N3. The second inductor 58 serves to function as a single reactance device along with the second resistor 60. The second resistor 60 limits an amount of the current going through the emitter of the first bipolar transistor 44. The second capacitor 54 and the second inductor 58 provides a feedback loop for feeding back an emitter output signal of the first bipolar transistor 44 via the second node N2 into the base thereof. This feedback loop makes a positive feedback of the emitter of the first bipolar transistor 44 into the base thereof to oscillate the first bipolar transistor 44. A gain of this feedback loop increases in the time of an impedance matching between the base and the emitter of the first bipolar transistor 44 to obtain a high level of oscillation signal. The impedance matching between the base and the emitter of the first bipolar transistor 44 is accomplished by reactance device and the third capacitor 56. The reactance device and the third capacitor 56 configures a serial resonance circuit to match the impedance in the base of the first bipolar transistor 44 with that in the emitter thereof; and at the same time configures a low pass filter to eliminate a harmonic component contained in the emitter output signal of the first bipolar transistor 44. This serial resonance circuit forms a dual resonator along with the resonator 42 in order to enhance a frequency selectively Q of the oscillating apparatus to maintain a high signal-to-noise ratio. On the other hand, the low pass filter bypasses toward the first voltage source 40 higher harmonic components than the cutoff frequency thereof in the emitter output signal of the first bipolar transistor 44 to feedback only the resonance components contained into the base of the first bipolar transistor 44. The cutoff frequency of the low pass filter is set to less frequency than a second harmonic in such a manner that the second harmonic as well as the higher order harmonics is eliminated entirely.

Furthermore, the high frequency oscillating apparatus comprises a fourth capacitor 62 connected between the first node N1 and the second node N2, and a third resistor 64 connected between the second voltage source 50 and the collector of the bipolar transistor 44, and a fifth capacitor 68 connected between the first node N1 and the output line 41. The fourth capacitor 62 allows only an alternate current to be delivered between the first node N1 and the second node N2. The third resistor 64 is used as a load resistance of the bipolar transistor 44. The fifth capacitor 68 allows only the oscillation signal on the first node N1 to be delivered into output line 41, and at the same time cuts off a noise signal of direct current component. The first voltage source 40 generates a ground voltage while the second voltage source 50 generates a certain level of voltage.

Moreover, the high frequency oscillating apparatus further comprises a variable frequency portion 70 connected the first node N1. The variable frequency portion 70 changes a capacitance value between the first node N1 and the first voltage source 40 to shift a frequency of the oscillation signal by the large width. For the purpose of this, the variable frequency portion 70 includes a sixth capacitor 72 connected between the first node N1 and a fourth node N4, a selection switch 74 connected between the fifth node N5 and the first voltage source 40, and a second bipolar transistor 76 connected among the fourth and fifth nodes N4 and N5 and the first voltage source 40. The selection switch 74 is turned on or off by an operation of user to generate a low or high logic signal at the fifth node N5. If a high logic signal is generate on the fifth node N5, then the second bipolar transistor 76 is turned on to connect the sixth capacitor 72 between the first node N1 and the first voltage source 40. At this time, the sixth capacitor 72 is connected with the first capacitor 48 in parallel to increase a capacitance value on the first node N1, thereby reducing a frequency of the oscillation signal generated on the first node N1. Otherwise, if a low logic signal is generated on the fifth node N5, then the second bipolar transistor 76 is turned off to separate the sixth capacitor 40 from the first voltage source 40. At this time, the sixth capacitor 72 is separated from the first capacitor 48 to decrease a capacitance value on the first node N1, thereby increasing a frequency of the oscillation signal generated on the first node N1. As a result, the sixth capacitor 72 variably changes the capacitance value on the first node N1 in response to the switching state of the selection 74 to thereby control an increase or decrease in a resonance frequency of the resonator 42. Further, the fourth resistor 78 connected between the second voltage source 50 and the fifth node N5 limits an amount of the current supplied the base of the second bipolar transistor 76.

Figure 15:
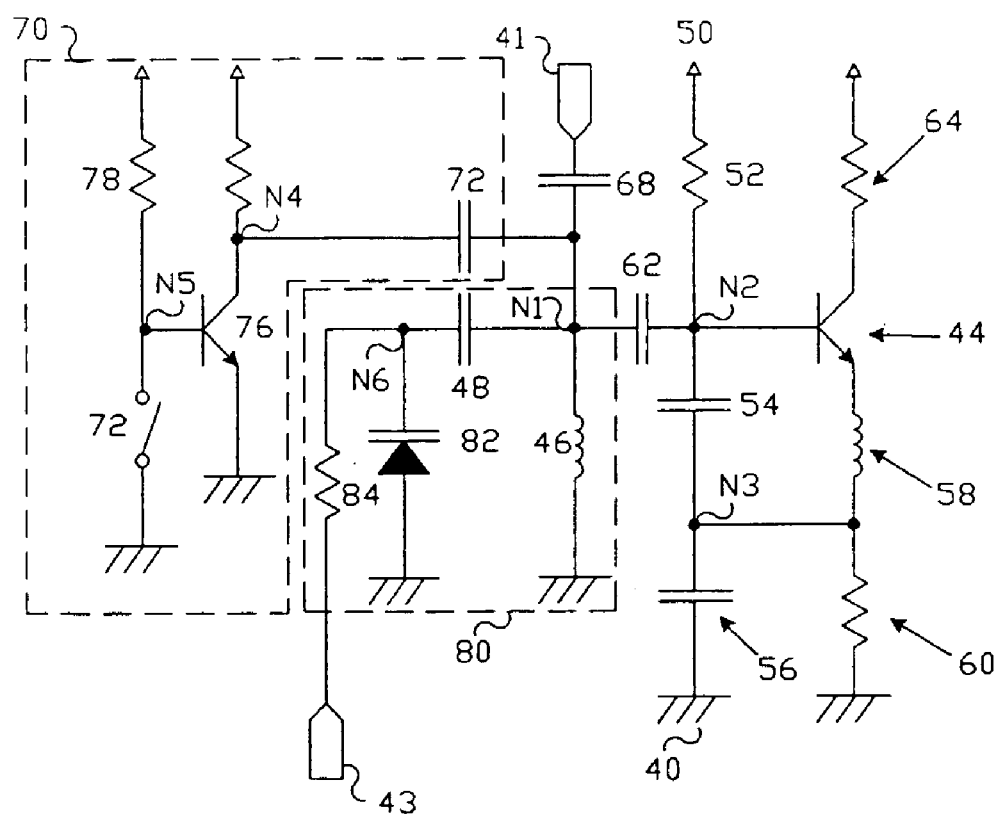
FIG. 15 is a circuit diagram of a high frequency oscillating apparatus in accordance with another embodiment of the present invention.

Referring to FIG. 15, there is shown a high frequency oscillating apparatus according to the sixth embodiment of the present invention which comprises a voltage controlled resonator 80 connected between the first node N1 and the first voltage source 40, and a bipolar transistor 44 having a base connected to the second node N2. The voltage controlled 80 serves to function as a pulsation means and also variably changes a frequency of the oscillation signal generated on the first node N1 in accordance with a magnitude of a voltage controlled signal from the input line 43. For the purpose of this, the voltage controlled resonator 80 is composed of a first inductor 46 connected between the first node N1 and the first voltage source 40, a first capacitor 48 between the first node N1 and a sixth node, a varector diode 82 connected between the sixth node N6 and the first voltage source 40, and a fifth resistor 84 connected between the sixth node N6 and the input line 43. The varector diode has such a capacitance value that the capacitance value thereof enlarges as a voltage controlled signal supplied via the input line 43 and the fifth resistor 84 with the sixth node N6 increases. A capacitance value of the varector diode 82 is combined in parallel with that of the first capacitor 48 to determine the capacitance value on the first node N1. The combined capacitance value of the varector diode 82 and the first capacitor 48 determines a frequency of the oscillation signal generated at the first node N1 together with the reactance value of the first inductor 46. The first bipolar transistor 44 is drived by a voltage applied via a first resistor 52 and the second node N2 from a second voltage source 50. The first resistor 52 is a bias resistor of the first bipolar transistor 44, which controls a value of the voltage supplied with the base of the first bipolar transistor 44.

Further, the high frequency oscillating apparatus comprises a second capacitor 54 connected between the second node N2 and a third node N3, a parallel connection of a third capacitor 56 and a second resistor 60 between the third node N3 and the first voltage source 40, and a second inductor 58 connected between an emitter of the first bipolar transistor 44 and the third node N3. The second inductor 58 serves to function as a single reactance device along with the second resistor 60. The second resistor 60 limits an amount of the current going through the emitter of the first bipolar transistor 44. The second capacitor 54 and the second inductor 58 provides a feedback loop for feeding back an emitter output signal of the first bipolar transistor 44 via the second node N2 into the base thereof. This feedback loop makes a positive feedback of the emitter of the first bipolar transistor 44 into the base thereof to oscillate the first bipolar transistor 44. A gain of this feedback loop increases in the time of an impedance matching between the base and the emitter of the first bipolar transistor 44 to obtain a high level of oscillation signal. The impedance matching between the base and the emitter of the first bipolar transistor 44 is accomplished by the second inductor 58 and the third capacitor 56. The second inductor 58 and the third capacitor 56 configures a serial resonance circuit to match the impedance in the base of the first bipolar transistor 44 with that in the emitter thereof; and at the same time configures a low pass filter to eliminate a harmonic component contained in the emitter output signal of the first bipolar transistor 44. This serial resonance circuit forms a dual resonator along with the voltage controlled resonator 42 in order to enhance a frequency selectively Q of the oscillating apparatus to maintain a high signal-to-noise ratio. On the other hand, the low pass filter bypasses toward the first voltage source 40 higher harmonic components than the cutoff frequency thereof in the emitter output signal of the first bipolar transistor 44 to feedback only the resonance frequency components contained into the base of the first bipolar transistor 44. The cutoff frequency of the low pass filter is set to less than the frequency of a second harmonic in such a manner that the second harmonic as well as the higher order harmonics is eliminated entirely.

Furthermore, the high frequency oscillating apparatus comprises a fourth capacitor 62 connected between the first node N1 and the second node N2, and a third resistor 64 connected between the second voltage source 50 and the collector of the bipolar transistor 44, and a fifth capacitor 68 connected between the first node N1 and the output line 41. The fourth capacitor 62 allows only an alternate current to be delivered between the first node N1 and the second node N2. The third resistor 64 is used as a load resistance of the bipolar transistor 44. The fifth capacitor 68 allows only the oscillation signal on the first node N1 to be delivered into output line 41, and at the same time cuts off a noise signal of direct current component. The first voltage source 40 generates a ground voltage while the second voltage source 50 generates a certain level of voltage.

Moreover, the high frequency oscillating apparatus further comprises a variable frequency portion 70 connected the first node N1. The variable frequency portion 70 changes a capacitance value between the first node N1 and the first voltage source 40 to shift a frequency of the oscillation signal by the large width. For the purpose of this, the variable frequency portion 70 includes a sixth capacitor 72 connected between the first node N1 and a fourth node N4, a selection switch 74 connected between the fifth node N5 and the first voltage source 40, and a second bipolar transistor 76 connected among the fourth and fifth nodes N4 and N5 and the first voltage source 40. The selection switch 74 is turned on or off by an operation of user to generate a low or high logic signal at the fifth node N5. If a high logic signal is generate on the fifth node N5, then the second bipolar transistor 76 is turned on to connect the sixth capacitor 72 between the first node N1 and the first voltage source 40. At this time, the sixth capacitor 72 is connected with the first capacitor 48 in parallel to increase a capacitance value on the first node N1, thereby reducing a frequency of the oscillation signal generated on the first node N1. Otherwise, if a low logic signal is generated on the fifth node N5, then the second bipolar transistor 76 is turned off to separate the sixth capacitor 40 from the first voltage source 40. At this time, the sixth capacitor 72 is separated from the first capacitor 48 to decrease a capacitance value on the first node N1, thereby increasing a frequency of the oscillation signal generated on the first node N1. Further, the fourth resistor 78 connected between the second voltage source 50 and the fifth node N5 limits an amount of the current supplied the base of the second bipolar transistor 76.

Figure 16:
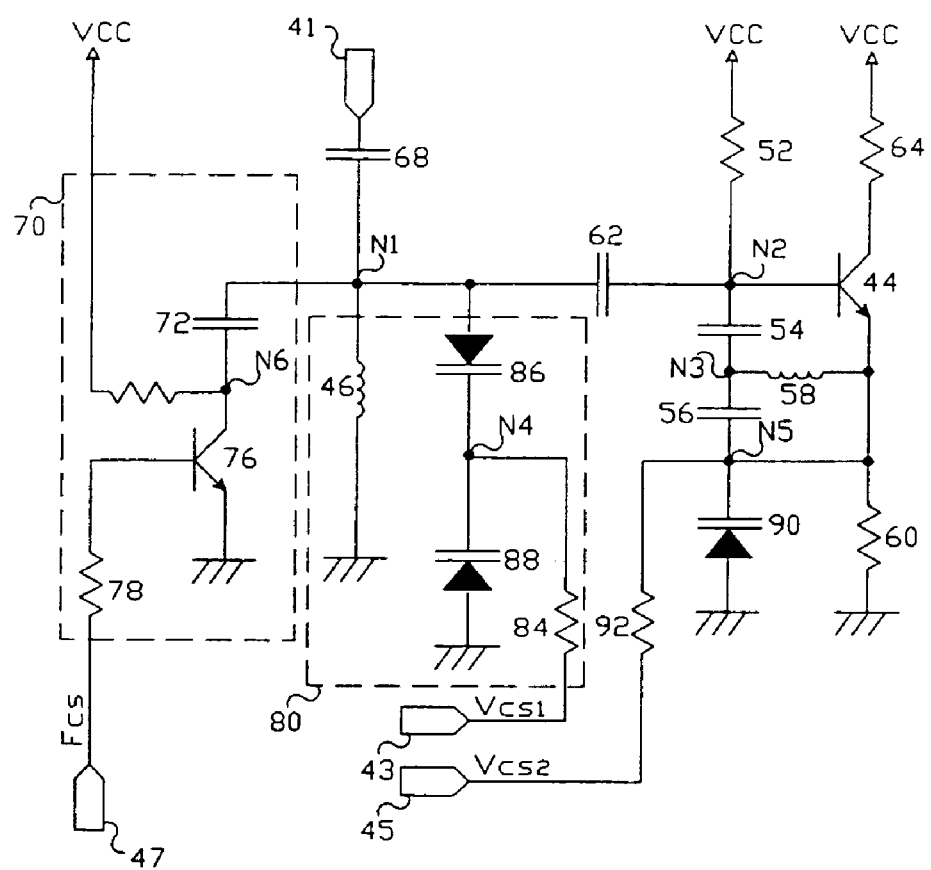
FIG. 16 is a circuit diagram of a high frequency oscillating apparatus in accordance with another embodiment of the present invention.

Referring to FIG. 16, there is shown a high frequency oscillating apparatus according to the seventh embodiment of the present invention which comprises a voltage controlled resonator 80 connected between the first node N1 and the first voltage source 40, and a first bipolar transistor 44 having a base connected to the second node N2. The voltage controlled resonator 80 serves to function as a pulsation means and also variably changes a frequency of the oscillation signal generated on the first node N1 in accordance with a magnitude of a voltage controlled signal VCS1 from the first input line 43. For the purpose of this, the voltage controlled resonator 80 is composed of a first inductor 46 connected between the first node N1 and the first voltage source 40, a first varector diode 86 connected between the first node N1 and a fourth node N4, a second varector diode 88 connected between the fourth node N4 and the first voltage source 40, and a fifth resistor 84 connected between the fourth node N4 and the first input line 43. The first and second varector diodes 86 and 88 have such a capacitance value that the capacitance value thereof enlarge as a voltage controlled signal supplied via the input line 43 and the fifth resistor 84 with the sixth node N6 increases. A capacitance value of the first varector diode 86 is combined in parallel with that of the second capacitor 88 to determine the capacitance value on the first node N1. The combined capacitance value of the first varector diode 86 and the second capacitor 88 determines a frequency of the oscillation signal generated at the first node N1 together with the reactance value of the first inductor 46. Accordingly, the first and second varector diodes 86 and 88 reduces a frequency of the oscillation signal generated on the first node N1 as a voltage of the first voltage controlled signal VCS1 on the first input line 43 increases. The first bipolar transistor 44 is drived by a voltage applied via a first resistor 52 and the second node N2 from a second voltage source 50. The first resistor 52 is a bias resistor of the first bipolar transistor 44, which controls a value of the voltage supplied with the base of the first bipolar transistor 44.

Further, the high frequency oscillating apparatus comprises a first capacitor 54 connected between the second node N2 and a third node N3, a second capacitor 56 connected between the third node N3 and the fifth node N5, a third varector diode 90 connected between the fifth node N5 and the first voltage source 40, a second inductor 58 connected between an emitter of the first bipolar transistor 44 and the third node N3, and a second resistor 60 connected between the emitter of the first bipolar transistor 44 and the first voltage source 40. The first capacitor 54 and the second inductor 58 provides a feedback loop for feeding back a signal from the emitter of the first bipolar transistor 44 via the second node N2 into the base thereof. This feedback loop makes a positive feedback of the emitter of the first bipolar transistor 44 into the base thereof to oscillate the first bipolar transistor 44. A gain of this feedback loop increases in the time of an impedance matching between the base and the emitter of the first bipolar transistor 44 to obtain a high level of oscillation signal. The impedance matching between the base and the emitter of the first bipolar transistor 44 is accomplished by the second inductor 58, the second capacitor 56 and the third varector diode 90. The second inductor 58, the second capacitor 56 and the third varector diode 90 configures a serial resonance circuit to match the impedance in the base of the first bipolar transistor 44 with that in the emitter thereof, and at the same time configures a low pass filter to eliminate a harmonic component contained in the emitter output signal of the first bipolar transistor 44. This serial resonance circuit forms a dual resonator along with the resonator 42 in order to enhance a frequency selectively Q of the oscillating apparatus to maintain a high signal-to-noise ratio. On the other hand, the low pass filter bypasses toward the first voltage source 40 higher harmonic components than the cutoff frequency thereof in the emitter output signal of the first bipolar transistor 44 to feedback only the resonance components contained into the base of the first bipolar transistor 44. The cutoff frequency of the low pass filter is set to less frequency than a second harmonic in such a manner that the second harmonic as well as the higher order harmonics is eliminated entirely. The third varector diode 90 has such a capacitance value that the capacitance value thereof increases progressively as the second voltage controlled signal VCS2 inputted via a sixth resistor 92 from the second input line 45 increases in the magnitude thereof. Further, the capacitance value of the third varector diode 90 is combined in parallel with that of the second capacitor 56 to increase or decrease a capacitance value between the third node N3 and the first voltage source 40 in accordance with the second voltage controlled signal VSC2. Accordingly, the low pass filter consisting of the second capacitor 56, the third varector diode 90 and the second inductor 58 has a cutoff frequency characteristic changed in response to the second voltage controlled signal VCS2. The second voltage controlled signal VSC2 is changed such that the phrase thereof is identical to that of the first voltage controlled signal VSC1, thereby allowing the low pass filter to eliminate the noise signals of the more than second order harmonic components of the oscillation signal generated on the first node N1. On the other hand, the second resistor 60 limits an amount of the current going through the emitter of the transistor 44.

Furthermore, the high frequency oscillating apparatus comprises a third capacitor 62 connected between the first node N1 and the second node N2, and a third resistor 64 connected between the second voltage source 50 and the collector of the bipolar transistor 44, and a fourth capacitor 68 connected between the first node N1 and the output line 41. The fourth capacitor 62 allows only an alternate current to be delivered between the first node N1 and the second node N2. The third resistor 64 is used as a load resistance of the bipolar transistor 44. The fourth capacitor 68 allows only the oscillation signal on the first node N1 to be delivered into output line 41, and at the same time cuts off a noise signal of direct current component. The first voltage source 40 generates a ground voltage while the second voltage source 50 generates a certain level of voltage.

Moreover, the high frequency oscillating apparatus further comprises a variable frequency portion 70 connected the first node N1. The variable frequency portion 70 changes a capacitance value between the first node N1 and the first voltage source 40 to control a frequency of the oscillation signal by the large width. For the purpose of this, the variable frequency portion 70 includes a fifth capacitor 72 connected between the first node N1 and a sixth node N6, a second bipolar transistor 76 connected among the third input line 47, the sixth node N6 and the first voltage source 40, and a fourth resistor 78 connected between the third input line 47 and the base of the second bipolar 76. The second bipolar transistor 76 connects and disconnects the fifth capacitor 72 between the first node N1 and the first voltage source 40 in accordance with a logical state of a frequency jump signal FJS applied from the third input line 47 via the fourth resistor 78 to the base thereof. Specially, if the frequency jump signal FJS remains at a high logic, then the second bipolar transistor 76 is turned on to connect the fifth capacitor 72 between the first node N1 and the first voltage source 40. At this time, the fifth capacitor 72 is connected in parallel with a serial connection of the first and second varector diodes 86 and 88 to increase a capacitance value on the first node N1, thereby reducing a frequency of the oscillation signal generated on the first node N1. Otherwise, if the frequency jump signal FJS remains at a low logic, then the second bipolar transistor 76 is turned off to separate the fifth capacitor 72 from the first voltage source 40. At this time, the sixth capacitor 72 is disconnected with the first and second varector diodes 86 and 88 to reduce a capacitance value on the first node N1, thereby increasing a frequency of the oscillation signal generated on the first node N1. Further, the sixth resistor 78 limits an amount of the current supplied with the base of the second bipolar transistor 76.

Figure 17:
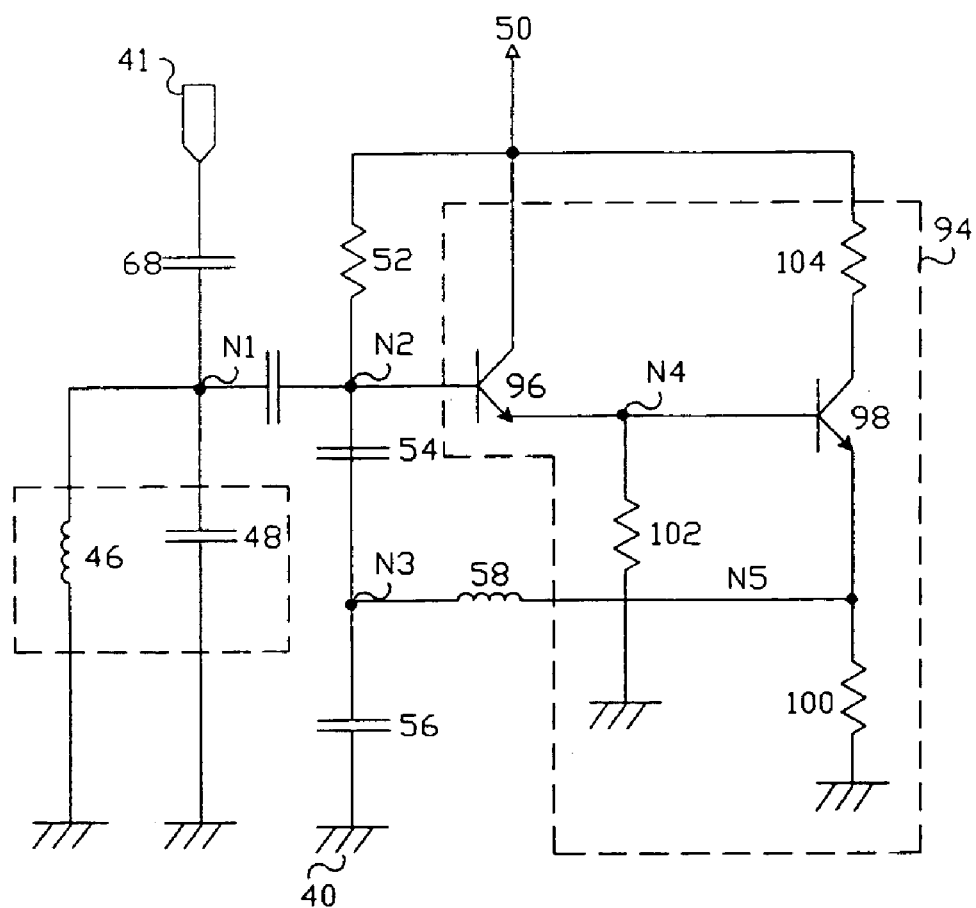
FIG. 17 is a circuit diagram of a high frequency oscillating apparatus in accordance with another embodiment of the present invention.

Referring to FIG. 17, there is shown a high frequency oscillating apparatus according to the eighth embodiment of the present invention which comprises a resonator 42 connected between the first node N1 and the first voltage source 40, and a Dalington circuit 94 connected to a second node N2. The resonator 42 consists of a parallel connection of a first inductor 46 and a first capacitor 48 between the first node N1 and the first voltage source 40 in order to serve to function as s pulsation means. A reactance value of the first inductor 46 and a capacitance value of the first capacitor 48 determines a frequency of the oscillation signal generated at the first node N1. Said Dalington circuit 94 is drived by a voltage applied via the first resistor 52 and the second node N2 from the second voltage source 50 to generate an oscillation signal with the frequency determined by the resonator 42. For the purpose of this, the Dalington circuit 94 is comprised of a first bipolar transistor 96 connected among the second node N2, the fourth node N4 and the second voltage source 50, a second bipolar transistor 98 having a base connected to the fourth node N4, a second voltage source 50, a second resistor 100 connected between an emitter of the second bipolar transistor 96 and the first voltage source 40, a third resistor 102 connected between the fourth node N4 and the first voltage source 40, and a fourth resistor 104 connected between an collector of the second bipolar transistor 98 and the first voltage source 50. The second resistor 100 limits an amount of the current going through the emitter of the second bipolar transistor 98 while the third resistor 102 limits an amount of the current going through the emitter of the first bipolar transistor 98. The first resistor 52 is a bias resistance of the Dalington circuit 94, which controls a value of the voltage supplied with the base of the first bipolar transistor 96.

Further, the high frequency oscillating apparatus comprises a second capacitor 54 connected between the second node N2 and a third node N3, a third capacitor 56 connected between the third node N3 and the first voltage source 40, and a second inductor 58 connected between the emitter of the second bipolar transistor 98 and the third node N3. The second capacitor 54 and the second inductor 58 provides a feedback loop for feeding back a signal from the emitter of the second bipolar transistor 98 via the second node N2 into the base thereof. This feedback loop makes a positive feedback of the emitter output signal of the second bipolar transistor 98 into the base thereof to oscillate the Dalington circuit 94. A gain of this feedback loop increases When an impedance of the base of the first bipolar transistor 96 is matched with that of the emitter of the second bipolar transistor 98, that is, when the input and output impedances of the Dalington circuit 94 are matched with each other, so that a high lecel of oscillation signal can be obtained. The impedance matching between the base of the first bipolar transistor 96 and the emitter of the second bipolar transistor 98 is accomplished by the second inductor 58 and the third capacitor 56. The second inductor 58 and the third capacitor cofigures a serial resonance circuit to match the impedance in the base of the first bipolar transistor 96 with that in the emitter of the second bipolar transistor 98, and at the same time configures a low pass filter to eliminate a harmonic component contained in the emitter output signal of the second bipolar transistor 98. This serial resonance circuit forms a dual resonator along with the resonator 42 in order to enhance a frequency selectively Q of the oscillating apparatus to maintain a high signal-to-noise ratio. On the other hand, the low pass filter bypasses toward the first voltage source 40 higher harmonic components than the cutoff frequency thereof in the emitter output signal of the second bipolar transistor 98 to feedback only the resonance components contained into the base of the first bipolar transistor 96. The cutoff frequency of the low pass filter is set to less frequency than a second harmonic in such a manner that the second harmonic as well as the higher order harmonics is eliminated entirely.

Furthermore, the high frequency oscillating apparatus comprises a fourth capacitor 62 connected between the first node N1 and the second node N2, and a sixth capacitor 68 connected between the first node N1 and the output line 41. The fourth capacitor 62 allows only an alternate current to be delivered between the first node N1 and the second node N2. The sixth capacitor 68 allows only the oscillation signal on the first node N1 to be delivered into output line 41, and at the same time cuts off a noise signal of direct current component. The first voltage source 40 generates a ground voltage while the second voltage source 50 generates a certain level of voltage.

As described above, a high frequency oscillating apparatus according to the present invention matches the input impedance of the feedback loop with the output impedance thereof to increase a gain of the feedback loop, so that it can enlarge an amplitude of oscillation signal. Also, the high frequency oscillating apparatus according to the present invention adds the feedback loop to the function of low pass filter in order to prevent the generation of harmonic components, thereby enhancing a signal-to-noise ratio. As a result, the high frequency oscillating apparatus according to the invention excludes from the high frequency circuit the support circuits, such as a band pass amplifier, a band limiting amplifier and a wide band amplifier, etc., which have to be added to the conventional high frequency circuit, so that it can simplify the high frequency as well as can provide a lower cost of high frequency circuit. Moreover, the high frequency oscillating apparatus provides an advantage in that it can generate various frequencies of oscillation signals be changing the resonance frequency variably and also can be adaptively employed in accordance with the oscillation frequencies.

While the invention has been described in conjunction with the specific embodiments in the detailed description of the invention, it will be understood that the invention can perform various modification and change. Accordingly, it will be understood that the specifications and drawings of the invention is not limited to the embodiments described above but illustrated for exemplifying the description thereof.

What is claimed is:

1. A high-frequency oscillation circuit comprising:

resonance means for generating oscillation frequency signals;

amplifying means having an input port for receiving the oscillation frequency signals originating from the resonance means and for amplifying the oscillation frequency signals originating from the resonance means;

an inductive element having one port connected to an output port of the amplifying means and forming part of a feedback loop which feeds back output signals originating from the output port of the amplifying means into the input port; and a capacitive element having one port connected to another port of the inductive element;

wherein another port of the capacitive element is grounded, the connection point of the inductive element and the capacitive element is connected to the input port of the amplifying means, and wherein the inductive element and the capacitive element compose an impedance matching means for matching the impedances of both ports of the feedback loop, the impedance matching means forming a low pass filter.

2. The oscillation circuit as set forth in claim 1, wherein the inductive element is an inductor, and the capacitive element is a capacitor.

3. The oscillation circuit as set forth in claim 1, wherein the capacitive element is a voltage control variable capacitive element.

4. The oscillation circuit as set forth in claim 1, wherein the impedance matching means forms a resonance circuit.

5. A high-frequency oscillation circuit comprising:

resonance means for generating oscillation frequency signals;

amplifying means having an input port for receiving the oscillation frequency signals originating from the resonance means and for amplifying the oscillation frequency signals originating from the resonance means;

a T-shaped matching element having one port connected to the output port of the amplifying means; and a capacitive element having one port connected to another port of the T-shaped matching element;

wherein another port of the capacitive element is grounded, wherein the connection point of the T-shaped matching element and the capacitive element is connected to the input port of the amplifying means.

6. The oscillation circuit as set forth in claim 5, wherein the T-shaped matching element comprises two serially-connected inductors and a capacitor connected with the connection point of the two inductors, and the capacitive element is a capacitor.

7. The oscillation circuit as set forth in claim 5, wherein the T-shaped matching element comprises two serially-connected inductors and a voltage control variable capacitive element connected with the connection point of the two inductors, with the capacitive element is a voltage control variable capacitive element.

8. The oscillation circuit as set forth in claim 5, wherein the T-shaped matching element forms a part of a feedback loop which feeds back the output signals originating from the output port of the amplifying means into the input port.

9. The oscillation circuit as set forth in claim 8, wherein the T-shaped matching element and the capacitive element compose an impedance matching means for matching the impedances of both ports of the feedback loop.

10. The oscillation circuit as set forth in claim 9, wherein the impedance matching means forms a resonance circuit.

11. The oscillation circuit as set forth in claim 9, wherein the impedance matching means forms a low pass filter.

12. The oscillation circuit as set forth in claim 1, wherein the connection point of the inductive element and the capacitive element is connected to the input port of the amplifying means via another capacitive element.

13. The oscillation circuit as set forth in claim 5, wherein the connection point of the T-shape matching element and the capacitive element is connected to the input port of the amplifying means via another capacitive element.

14. A high-frequency oscillation circuit comprising:

resonance means for generating oscillation frequency signals;

amplifying means having an input port for receiving the oscillation frequency signals originating from the resonance means and for amplifying the oscillation frequency signals originating from the resonance means;

a strip line having one port connected to the output port of the amplifying means; and a capacitive element having one port connected to the strip line;

wherein another port of the capacitive element is grounded, wherein another port of the strip line is connected to the input port of the amplifying means.

15. The oscillation circuit as set forth in claim 14, wherein the capacitive element is a voltage control variable capacitive element.

16. The oscillation circuit as set forth in claim 14, wherein the strip line forms a part of a feedback loop which feeds back output signals originating from the output port of the amplifying means into the input port.

17. The oscillation circuit as set forth in claim 15, wherein the strip line and the capacitive element compose impedance matching means for matching impedances of both ports of the feedback loop.

18. The oscillation circuit as set forth in claim 17, wherein the impedance matching means forms a resonance circuit.

19. The oscillation circuit as set forth in claim 17, wherein the impedance matching means forms a low pass filter.

20. The oscillation circuit as set forth in claim 14, wherein another port of the strip line is connected to the input port of the amplifying means via another capacitive element.

21. A high frequency oscillating apparatus, comprising:

resonance means connected between a first node and a first voltage source for determining a frequency of an oscillation signal to be generated on said first node;

a bipolar transistor having a base connected to said first node and having a collector connected to a second voltage source;

a first capacitive device connected between said first node and a second node;

a second capacitive device connected between said second node and said first voltage source;

a third capacitive device connected between a third node and said first voltage source; and a reactive device connected between an emitter of said bipolar transistor and said second node, wherein the reactive device and said third capacitive device compose an impedance matching means for matching the impedances of the base and the emitter of the bipolar transistor, the impedance matching means forming a low pass filter.

22. The high frequency oscillating apparatus as set forth in claim 21, which further comprises a resistor connected between the emitter of said bipolar transistor and said first voltage source for limiting a current amount.

23. The high frequency oscillating apparatus as set forth in claim 21, which further comprises a resistor connected between said second node and said first voltage source for limiting a current amount.

24. A high frequency oscillating apparatus, comprising:

resonance means connected between a first node and a first voltage source for determining a frequency of an oscillation signal to be generated on said first node;

a field effect transistor having a gate connected to said first node and a drain connected to a second voltage source;

a first capacitive device connected between said first node and a second node;

a second capacitive device connected between said second node and said first voltage source;

a third capacitive device connected between a third node and said first voltage source; and a reactive device connected between a source of the field effect transistor and said second node, wherein the reactive device and said third capacitive device compose an impedance matching means for matching the impedances of the gate and the source of the field effect transistor, the impedance matching means forming a low pass filter.

25. The high frequency oscillating apparatus as set forth in claim 21, wherein the oscillation signal is taken from the base of the bipolar transistor.

* * * * *